United States Patent
Rashkovan et al.

(10) Patent No.: US 6,900,065 B2
(45) Date of Patent: May 31, 2005

(54) APPARATUS AND METHOD FOR ENHANCED VOLTAGE CONTRAST ANALYSIS

(75) Inventors: Vicky Rashkovan, Ogakim (IL); Dror Shemesh, Petach-Tikva (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

(21) Appl. No.: 10/327,398

(22) Filed: Dec. 19, 2002

(65) Prior Publication Data

US 2004/0075458 A1 Apr. 22, 2004

Related U.S. Application Data

(60) Provisional application No. 60/420,398, filed on Oct. 21, 2002.

(51) Int. Cl.[7] .......................... H01L 21/66; G01R 31/26; G01R 31/08
(52) U.S. Cl. .......................... 438/17; 438/14; 324/512; 324/522; 324/765
(58) Field of Search .................... 438/14, 17; 324/512, 324/522, 765

(56) References Cited

U.S. PATENT DOCUMENTS 6,448,099 B1 * 9/2002 Iacoponi et al. .............. 438/17
6,544,802 B1 * 4/2003 Jun et al. ...................... 438/14

* cited by examiner

Primary Examiner—Craig A. Thompson
Assistant Examiner—Nema Berezny
(74) Attorney, Agent, or Firm—Blakely, Sokoloff, Taylor & Zafman

(57) ABSTRACT

An apparatus and a method for electrically testing a semiconductor wafer, the method including: (i) depositing electrical charges at certain points of a test pattern; (ii) scanning at least a portion of the test pattern such as to enhance charge differences resulting from defects; and (iii) collecting charged particles emitted from the at least scanned portion as a result of the scanning, thus providing an indication about an electrical state of the respective test structure.

45 Claims, 7 Drawing Sheets

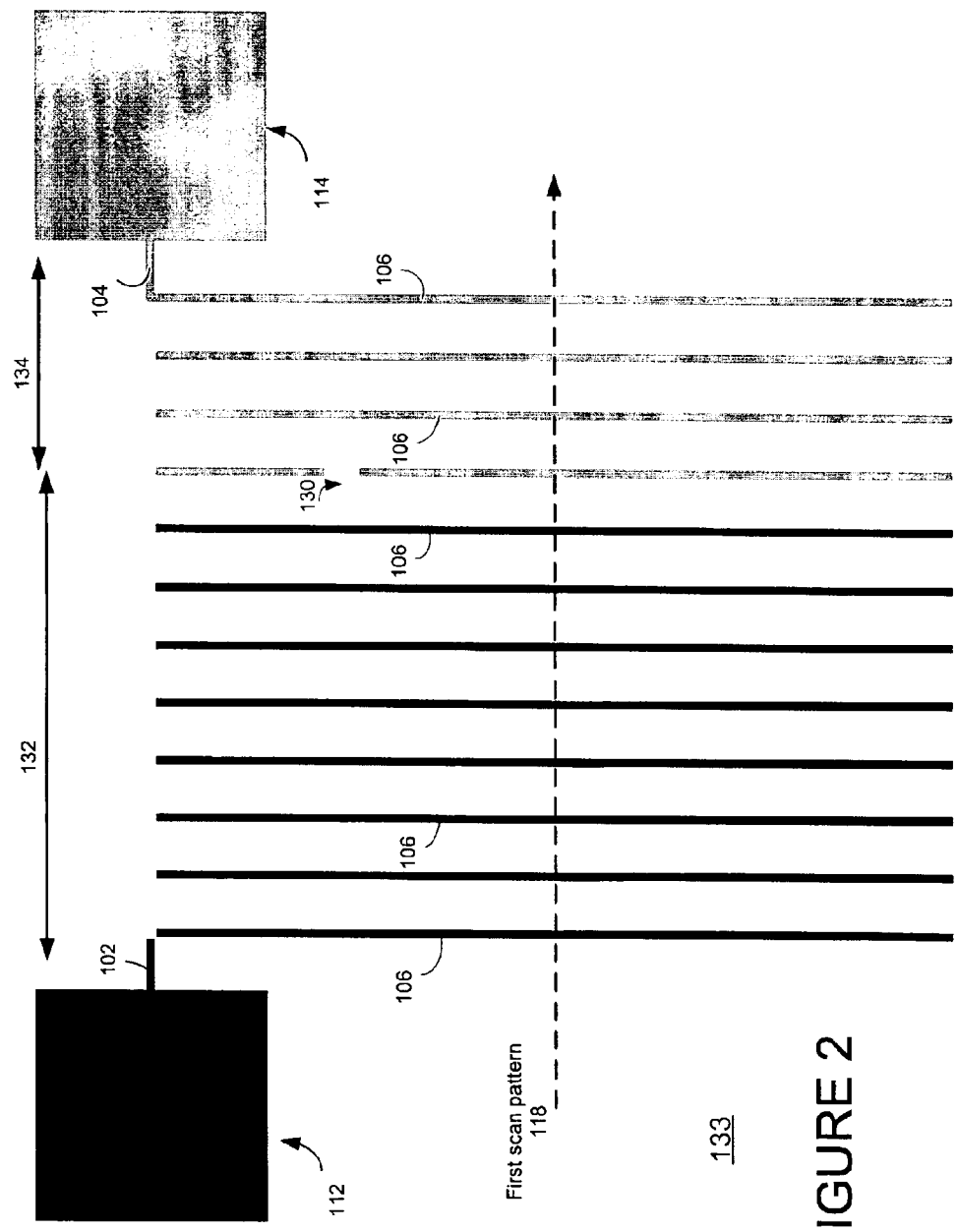

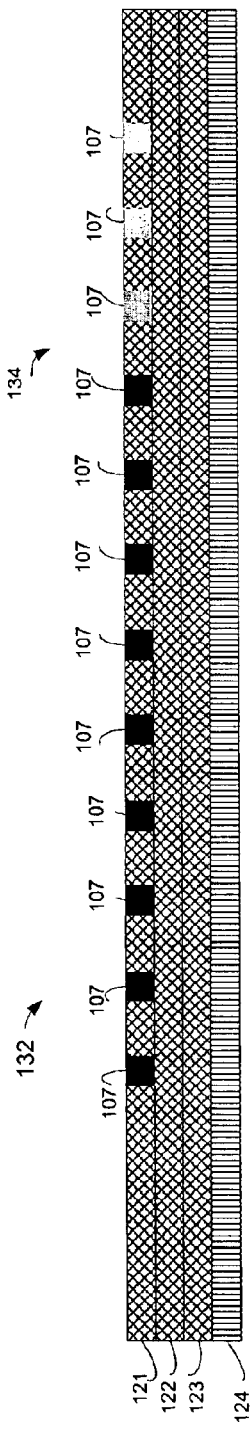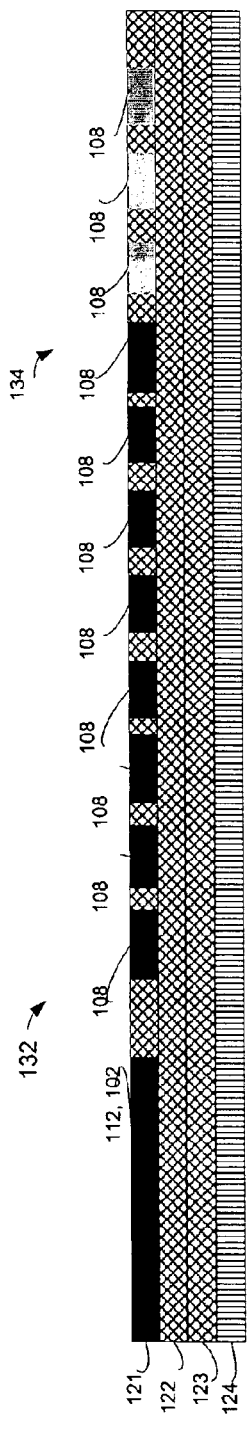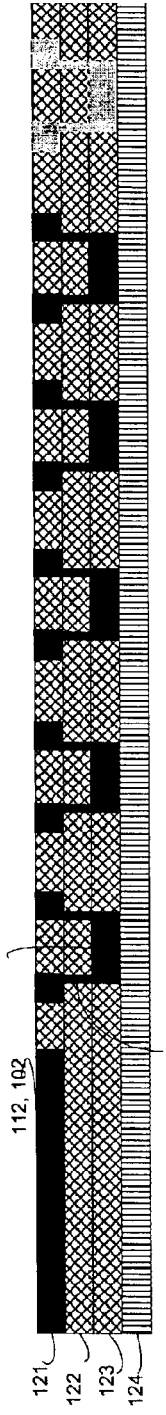
FIGURE 3A - CROSS SECTION OF TEST STRUCTURE 100 ALONG FIRST SCAN PATTERN
FIGURE 3B - CROSS SECTION OF TEST STRUCTURE 100 ALONG AXIS FROM FIRST END 102 TO SECOND END 104
FIGURE 3C - CROSS SECTION OF TEST STRUCTURE 130 ALONG AXIS FROM FIRST END 132 TO SECOND END 134

APPARATUS AND METHOD FOR ENHANCED VOLTAGE CONTRAST ANALYSIS

RELATED APPLICATIONS

This application claims the benefit of U.S. provisional application Ser. No. 60/420,398 filed Oct. 21, 2002.

FIELD OF THE INVENTION

This invention relates to apparatus and method for inspecting and testing semiconductors wafers during circuit fabrication and, in particular, for testing test structures in a voltage-contrast mode.

BACKGROUND OF THE INVENTION

Integrated circuits are very complex devices that include multiple layers. Each layer may include conductive material, isolating material and/or semi-conductive materials. These various materials are arranged in patterns, usually in accordance with the expected functionality of the integrated circuit. The patterns also reflect the manufacturing process of the integrated circuits. It is noted that integrated circuits are manufactured by complex multi-staged manufacturing processes.

Commonly an integrated circuit includes a substrate, multiple conductive layers (also known as metal layers) and multiple dielectric layers. Conductive layers usually include conductors made of conductive materials, whereas the conductors are separated by isolating materials such as various oxides. The dielectric layers are located between the conductive layers in an interlaced manner. Conductors of distinct conductive layers may be connected to each other and/or to the substrate by conductive materials (termed interconnects or vias) located within the dielectric layers. The substrate may include semi-conducting materials and at least a portion of the substrate is connected to a virtual ground.

Various inspection and failure analysis techniques evolved for inspecting integrated circuits both during the fabrication stages, between consecutive manufacturing stages, either in combination with the manufacturing process (also termed "in line" inspection techniques) or not (also termed "off line" inspection techniques). Various optical as well as charged particle beam inspection tools and review tools are known in the art, such as the Compluss™ and SEMVision™ of Applied Materials Inc. of Santa Clara, Calif.

Manufacturing failures may affect the electrical characteristics of the integrated circuits. Some of these failures result from unwanted disconnections between various elements of the integrated circuits. These failures are known as "open". Other failures result from unwanted connections between various elements of the integrated circuits. These failures may include unwanted connections between isolated conductors, unwanted connections between a conductor and the ground via the substrate. These failures are also known as "shorts".

A well-known inspection technique is the "voltage contrast technique". This technique usually includes a charging stage and an imaging stage. During the charging stage an electron beam is directed onto a portion of a test structure (usually a large sized pad that can be relatively easily located), whereas isolated and non-grounded conductors are charged, thus forming charged patterns. During the imaging stage an electron beam is scanned across the test pattern whereas voltage potential level of a scanned point is reflected by an intensity level of secondary electrons emitted from said point. Accordingly, the imaging stage provides charging patterns that may be compared to previously scanned test structures and/or to expected/ previously stored and/or calculated results.

Voltage contrast techniques are described in various publications, including U.S. Pat. No. 6,445,199 of Satya et al., U.S. Pat. No. 6,448,099 of Iacoponi et al., and U.S. Pat. No. 5,959,459 of Satya et el., all three patents are incorporated herein by reference.

Some prior art methods are based upon a comparison between grounded conductors and isolated conductors that remain charged after the charging stage. Some prior art methods are limited to highly isolated test structures, while some may impose strict limitation upon the "imaging" particle beam, such as a short duration or the inducement of minimal voltage changes. A prior art method that imposes strict limitations upon the "imaging" particle beam is described at "A dynamic single E-beam short/open testing technique", M. Brunner, B. Lischke, Scanning Electron Microscopy/1985/III, pages 991–999, SEM Inc. which is also incorporated herein by reference.

A method that was tested on printed circuit boards is described at "Bare-board e-beam testing: The charge storage problem", M. Brunner, N. Kolbenschlag and B. Lischke, Microelectronic Engineering 8 (1988) 25–35, Elsavier Science Publishers B.V. (North-Holland), which is also incorporated herein by reference. According to this method a scanning beam scans a circuit while a large holding beam stabilizes the charge of the tested circuit.

Thus there is a clear need for a compact system and method for enhancing the sensitivity of voltage contrast analysis. There is a further need to provide a voltage contrast analysis technique that is applicable to conductors that are not grounded. There is a need to provide a voltage contrast analysis technique that is applicable to conductors that are not highly isolated from the ground, are not electronically connected to fixed voltage sources and/or are not exposed to holding beam.

SUMMARY OF THE INVENTION

The invention provides a method for electrically testing a semiconductor wafer, the method including the steps of: (i) depositing electrical charges at certain points of a test pattern, (ii) scanning at least a portion of the test pattern such as to enhance charge differences resulting from defects, and (iii) collecting charged particles emitted from the at least scanned portion as a result of the scanning, thus providing an indication about an electrical state of the respective test structure.

The invention provides an apparatus for electrically testing a semiconductor wafer, the apparatus including: (i) means for depositing electrical charges at certain points of a test pattern; (ii) means for scanning at least a portion of the test pattern such as to enhance charge differences resulting from defects; and (iii) means for collecting and analyzing charged particles emitted from the at least scanned portion as a result of the scanning, operable to provide an indication about an electrical state of the respective test structure.

Conveniently, the apparatus is operable to direct a beam of electrons towards the test structure, and preferably the apparatus is a SEM, but this is not necessarily so. The means for depositing electrical charges may include at least one electron gun and focusing arrangement that are operable to extract electrons from the electron gun and direct them towards the test wafer.

The focusing arrangement may include at least one magnetic and/or electrostatic lenses, condensers, aberration correction means, beam shaping devices and the like, and any combination of them.

The means for scanning may include electrical and/or mechanical means that introduce a relative movement between the wafer and the electron beam. The scanning may be implemented by a substantially constant movement along at least one axis, but this is not necessarily so and the scanning may also be implemented by various means, such as by a step and scan mechanism.

The means for collecting and analyzing the charged particle may include at least one detector operable to detect various types of particles, such as x-ray, secondary electrons, backscattered electrons and the like, or a combination of at least two of said detectors. The at least one detector is usually connected to a signal processing device, that processed the signals provided by the detectors to determine the condition of the tested wafer. The process may implement die-to-die techniques, die-to database techniques and/or die-to simulated results or a combination of these techniques.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIGS. 1–2 are schematic description of defective test patterns, in accordance with embodiments of the invention;

FIG. 3A is a schematic description of a cross section of the faulty test pattern of FIG. 1, along a first axis, in accordance with an embodiment of the invention;

FIG. 3B is a schematic description of a cross section of the faulty test pattern of FIG. 1, along a second axis, in accordance with an embodiment of the invention;

FIG. 3C is a schematic description of a cross section of the faulty test pattern of FIG. 2, along a first axis, in accordance with an embodiment of the invention;

DETAILED DESCRIPTION OF THE INVENTION

Figure 1:
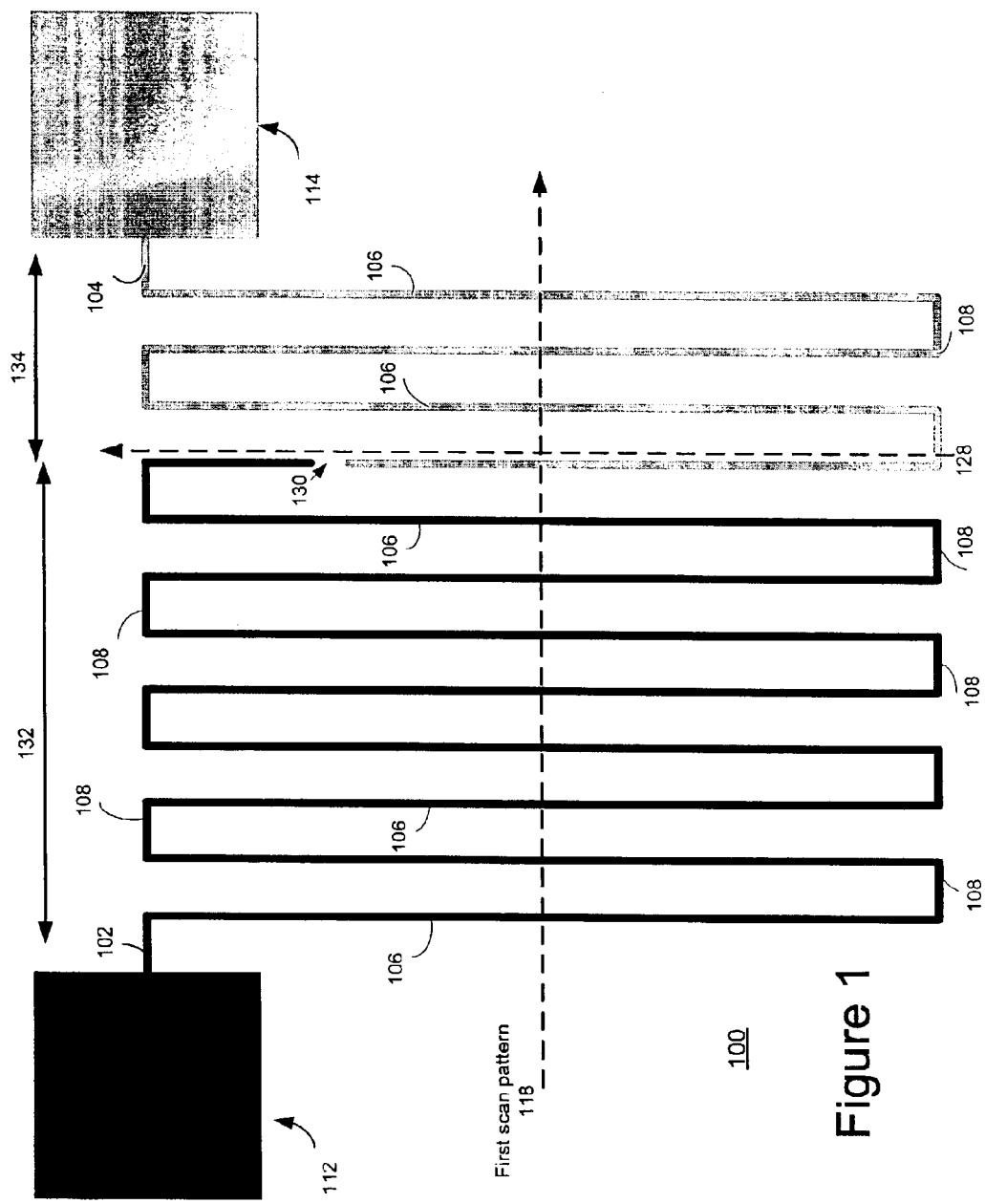

The following description relates to charged particle microscopes, such as Scanning Electron Microscopes (SEMs), such as step and repeat type SEMs, in which wafer is scanned by repetitive steps of scanning an area of the wafer (said area defined by the field of view of the SEM) and mechanically introducing a movement between the wafer and SEM to facilitate the scanning of another area. Said movement may also be implemented by electrostatic and/or magnetic fields introduced by various electrostatic and/or magnetic elements such as lens, deflectors and the like.

It is noted that other charged particles and even photons may be utilized for detecting voltage contrast. It is further noted that this invention may also be implemented by introducing a substantially constant movement between the SEM and the wafer. The movement may be linear or even rotational, and/or any combination of both movements.

The term "isolated" refers to a resistance range that exceed an upper threshold. Accordingly, a continuation may introduce a resistance that is higher than an upper threshold and the term "open" also refers to the presence of a resistance that exceeds an upper threshold. The upper value usually is not infinite, and depends upon the characteristics of the wafer and/or a defect/abnormality/manufacturing failure.

It is further noted that multiple test patterns and multiple scanning paths can be implemented within the scope of the invention. It is further noted that the location, size and density of test patterns may vary on a wafer to wafer basis but even on a die to die basis. A test structure may be sized along one dimension, to fit within a scribeline; the size along the other dimension may be any.

Furthermore, test structures may be electrically connected to each other to form groups of various sizes and various electrical characteristics. At least some members of the group may be connected to a virtual ground, but this is not necessarily so and in many cases the suggested system and method is very effective when the test structures are not electrically connected to a virtual ground (are floating). It is further noted that the mentioned below method and system may be used to test various test patterns, such as but not limited to prior art test structures described in U.S. Pat. No. 6,445,199 of Satya et al.

The invention provides a highly sensitive voltage contrast technique. The technique enables to amplify or enhance voltage contrasts resulting from faults, and is especially useful to detect faults in floating test structures. It is noted that the technique is also suited to analyze test structures that have an end that is contained at a constant voltage, such as a grounded test structure.

According to another aspect of the invention the system and apparatus are also suited to locate faults in the presence of relatively time-dependent charging patterns, and especially in cases where deposited electrical charges discharge during a relatively short time period.

According to yet a further aspect of the invention it enables to space apart the step of charging and the step of scanning, thus relaxing various mechanical and/or other limitations imposed on the SEM.

It is noted that the conductor of each test pattern are shown to be identical; however in practice they may be different. They could consist of entirely different circuits or of identically patterned circuits but with slightly different features or dimensional parameters. In the latter case, they would be subject to faults under slightly different fabrication process conditions, or may have different probabilities of faults under given conditions—all of which may be utilized for sensitive monitoring of the process. It will be appreciated that the number of circuits in the structure, and consequently the number of pads, may also be different from four—for example, two, six or eight.

FIGS. 1, 3A and 3B illustrate a serpentine shaped test pattern 100 having a first end 102 and a second end 104 that are connected to first pad 112 and second pad 114. Test pattern 100 includes multiple relatively long and substantially parallel latitudinal conductors 106 that are connected to each other by relatively short longitudinal conductors 108.

FIGS. 2 and 3C illustrate a multi-layered serpentine shaped test pattern 133. The conductors that form test structure 133 are located within three layers, an upper layer 121, a lower layer 123 and an intermediate layer 122. Interconnecting conductors, such as vias 109, that are located within intermediate layer 122 interconnect substantially parallel latitudinal conductors 106 that located within first layer 121 to relatively short longitudinal conductors 108 that are located within third layer 123. The three layers 121–124 are positioned above substrate 124. It is noted that the amount of layers, as well as the arrangement of conductors within the layers may vary without exceeding the scope of the invention.

According to an aspect of the invention both pads 112 and 114 are isolated from the ground. In order to detect a discontinuity in test pattern 100, the first pad 112 is first charged with an electric charge by directing an electron beam onto first pad 112, and then performing a first scan, along a longitudinal axis of test pattern 100, thus defining a first scan pattern 118. It is noted that although first scan pattern 118 is positioned at the middle of test pattern 100, this is not necessarily so. Assuming that the length of each latitudinal conductor 106 is V and that the length of each short longitudinal conductors 108 if H then the first scan path samples test pattern 100 at points (such as points 107) that are located (H+V) from each other.

FIGS. 1–3C illustrate test patterns that include a discontinuity 130. It is noted that the invention is operable to detect multiple discontinuities. Discontinuity 130 divides each of test patterns 100 and 133 to two portions—a left hand portion that starts at first end 102 (or rather first pad 112) and ends at discontinuity 130, and a right hand portion that starts at discontinuity 130 and ends at second end 104 (or rather second pad 114). The right hand portion is referred to as first conductive portion 132 and to left hand portion will be referred to as second conductive portion 134.

It is noted that the charge that was induced on first pad 112 during the charging step will remain within first conductive portion 132 and will almost not propagate beyond discontinuity 130 towards second conductive portion 134. Furthermore, during a first phase 117 of the first scan pattern 118, that includes scanning portions of first conductive portion 132, the first conductive portion 132 will be charged, while the second conductive portion 134 will not be charged. Accordingly, the scanning itself enhanced the voltage contrast. Accordingly, once discontinuity 130 is arrived, the collected charges from the left side of discontinuity 130 will reflect a certain charge level while the collected charges from the right side of discontinuity 130 will reflect a lower charge level.

It is further noted that while both first and second pads are floating the scanning direction can be reversed. On the other hand, if one of first and second pads 112 and 114 is grounded, the other pad shall be charged and the scanning pattern must initiate from that other pad.

Assuming that the first scan pattern 118 indicates that a discontinuity 130 exists, a second scanning pattern, such as latitudinal scan pattern 128 shall be initiated, for locating the exact location of discontinuity 130.

Figure 4:
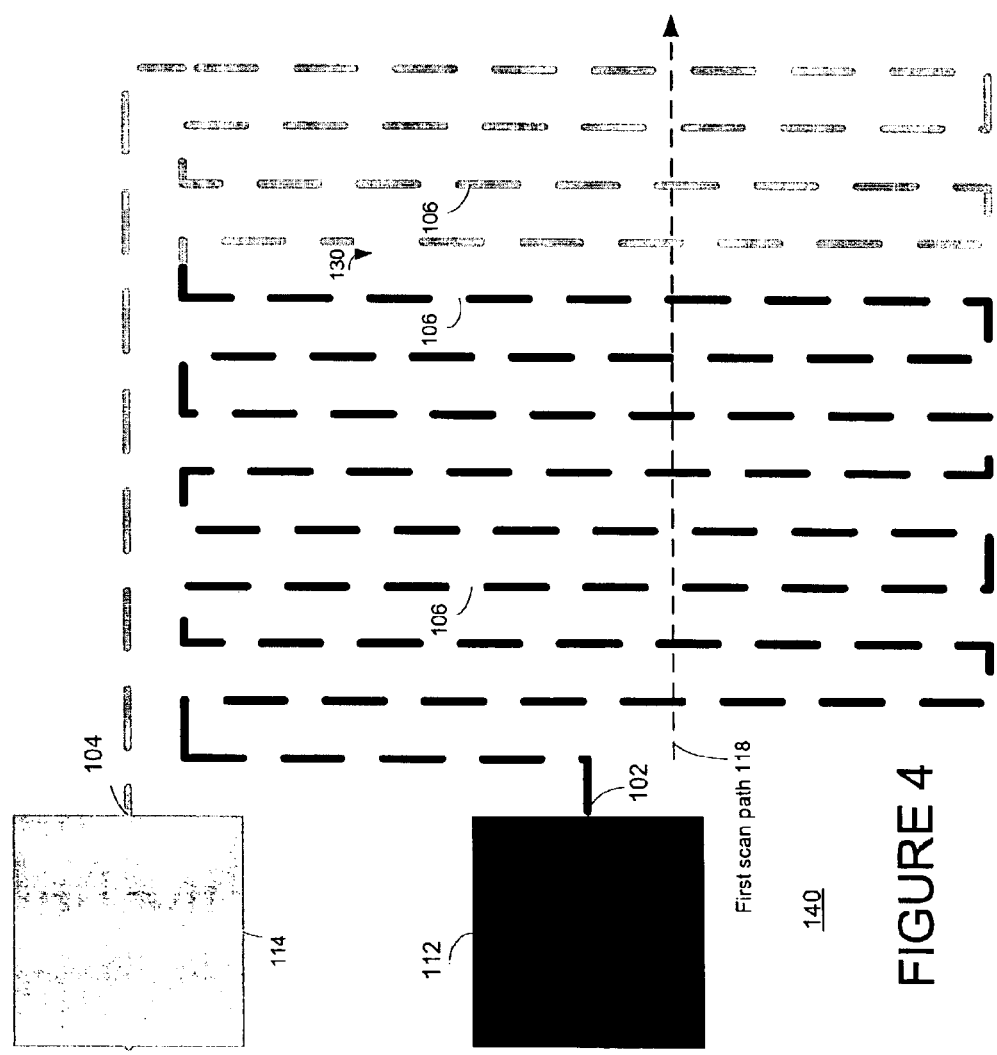
FIG. 4 illustrates a multilayered test pattern 140, in accordance to an aspect of the invention.

FIG. 4 illustrates another multilayered test pattern 140, in accordance to another aspect of the invention. Both first and second pads 112 and 144 are positioned in proximity to each other. Test pattern 140 consists of a large number of conducting segments that form conductors 180 and 106, on each of two layers, whereas only the upper one of which is shown. The segments on the lower layer are not shown. The segments are connected in series, alternatingly between the layers, through vias, to form a single conductive chain.

It is noted that first scanning paths 118 may be completed during a single scanning step, during multiple step and scan iterations, or be implemented by a continues scanning SEM.

The enhancement of voltage contrast may enable a relatively slow scanning scheme, in relation to the discharge period of charges introduced during the charging and scanning steps. It is further noted that although the first and scanning paths 118 and 128 are sketched as two lines, they represent a segment of an image that is defined by the FOV of the SEM, whereas even that FOV may be altered during testing. Larger FOV enable to image larger portions of test structures 133, 100 and 140, while smaller FOV usually are designed to provide better resolution.

According to another aspect of the invention the test patterns may also be a part of a larger array of test pattern and/or form a part of test patterns that may also be utilized for detecting shorts. A typical test pattern for detecting shorts includes at least two comb shaped isolated conductor arrangements facing each other, while their teethes are interdigited.

According to yet a further aspect of the invention a test pattern, such as test pattern 100, 133 and/or 140 may be a part of a group of test structures. At least a portion some of the test structures may be electrically connected to each other, but this is not necessarily so. Usually, not all the test structures of the group undergo the whole testing procedure, and the method includes a preliminary selection step. The selection may be responsive to input data either previously entered to the SEM, or as a result of other tests of the die or wafer. For example, a certain test structure that is susceptible to a certain manufacturing failure may be selected if this aspect of the manufacturing process is to be examined. The selected test structure can be selected in response to the stage of manufacturing that preceded the voltage contrast analysis, or even in response to a predefined design of that wafer.

Figure 5:
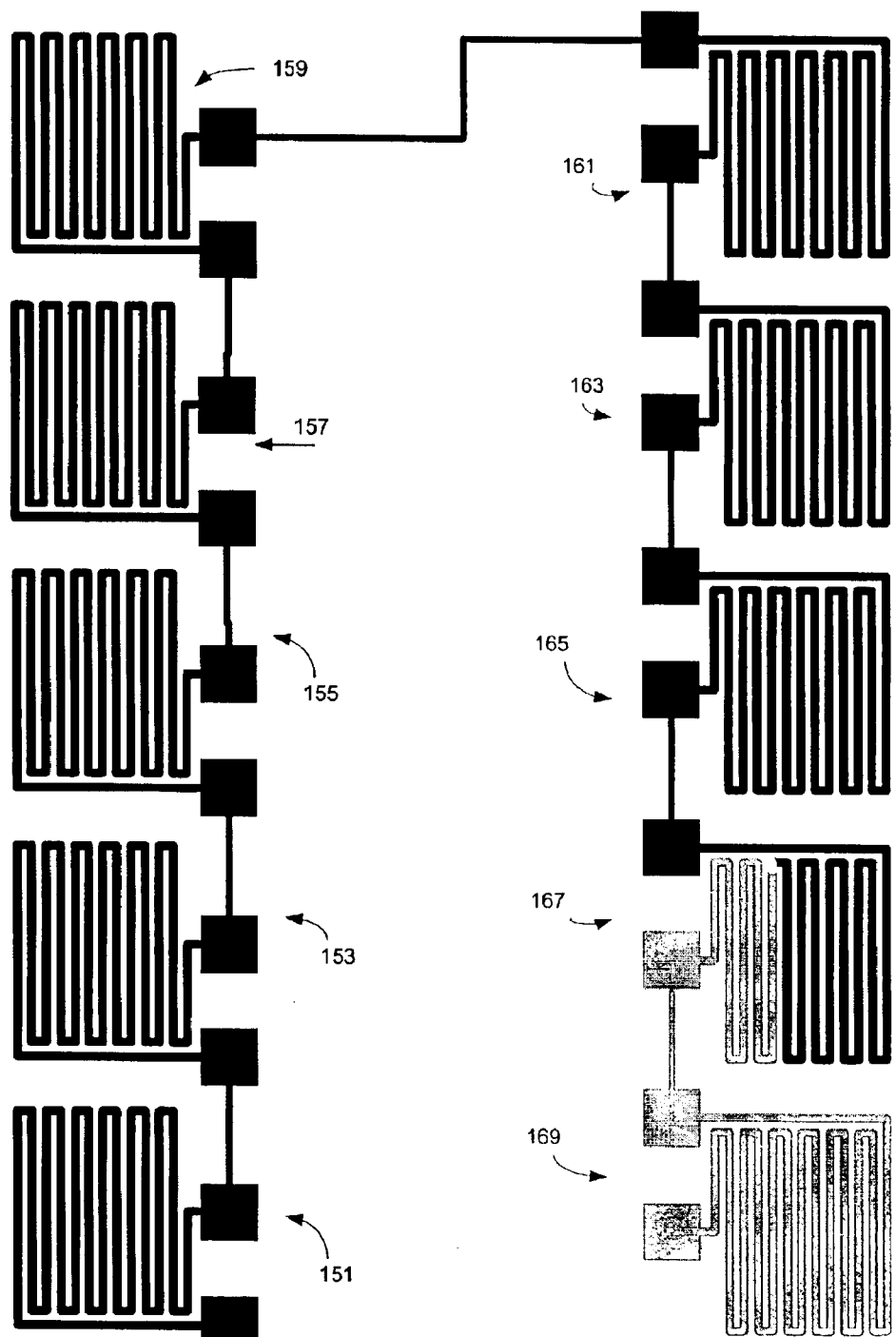
FIG. 5 illustrates a faulty group of electrically connected test structures, in accordance to an aspect of the invention.

FIG. 5 illustrates a faulty group 150 of electrically connected test structures, in accordance to an aspect of the invention. Each test pattern 151–169 has two pads electrically connected to each other, and all test patterns are serially electrically connected to each other. Test pattern 151 is charged by directing an electron beam to one of its pads. A discontinuity occurs at test structure 167, thus the charge propagates via test structures 151–167 and part of test structure 167. The pads of all test structures may be rapidly imaged to determine whether one of the test structures is defective. Accordingly, due to the contrast between the pads of test structure 167, there is high probability that it is defective, thus this test structure is further analyzed. It is noted that not all the test structure must have the same shape and/or other characteristics, or have the same dimensions. It is further noted that the amount of conductors that form each test pattern usually well exceeds the amount of conductors (such as 108 and 106) that are illustrated at the previous figures.

Figure 6:
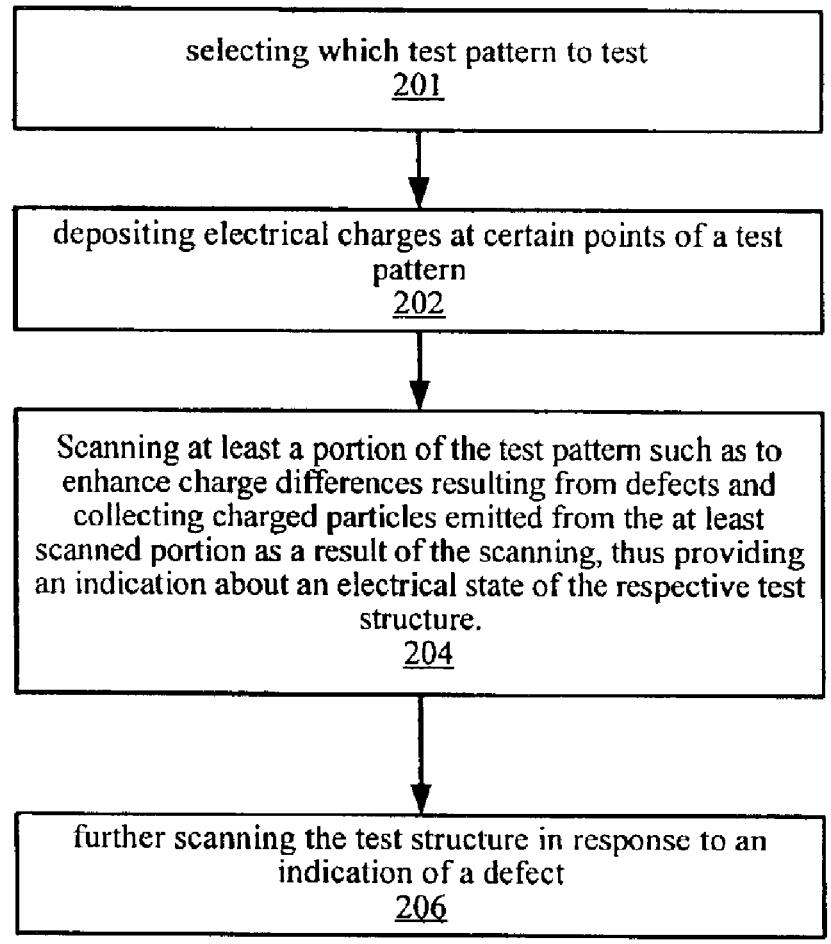
FIGS. 6–7 are flow charts illustrating methods for electrically testing of semiconductors.

FIG. 6 is a flow chart illustrating a method 200 for electrically testing a semiconductor wafer.

Method 200 starts by step 202 of depositing electrical charges at certain points of a test pattern. For example, referring to test structure 100, first pad 112 is charged.

Step 202 is followed by step 204 of scanning at least a portion of the test pattern such as to enhance charge differences resulting from defects. Referring to FIG. 1, during a first phase 117 of the first scan pattern 118, that includes scanning portions of first conductive portion 132, the first conductive portion 132 will be charged, while the second conductive portion 134 will not be charged. Accordingly, the scanning itself enhanced the voltage contrast. Step 204 further includes collecting charged particles emitted from the at least scanned portion as a result of the scanning, thus providing an indication about an electrical state of the respective test structure. This may include generating an image that represents the charging pattern resulting from steps 202 and 204 or an image that represents a portion of that scanning pattern, usually in proximity to first scan path 118.

Step 204 may be followed by a step 206 of further scanning the test structure in response to an indication of a defect. For example, step 206 may include scanning along second scan path 128.

It is noted that the scanning paths 118 and 128 are sketched as being parallel to conductors 106 and 108 and orthogonal to each other, but this is not necessarily so.

According to another aspect of the invention, step 202 is preceded by a preliminary step 201 of selecting which test pattern to test.

Figure 7:
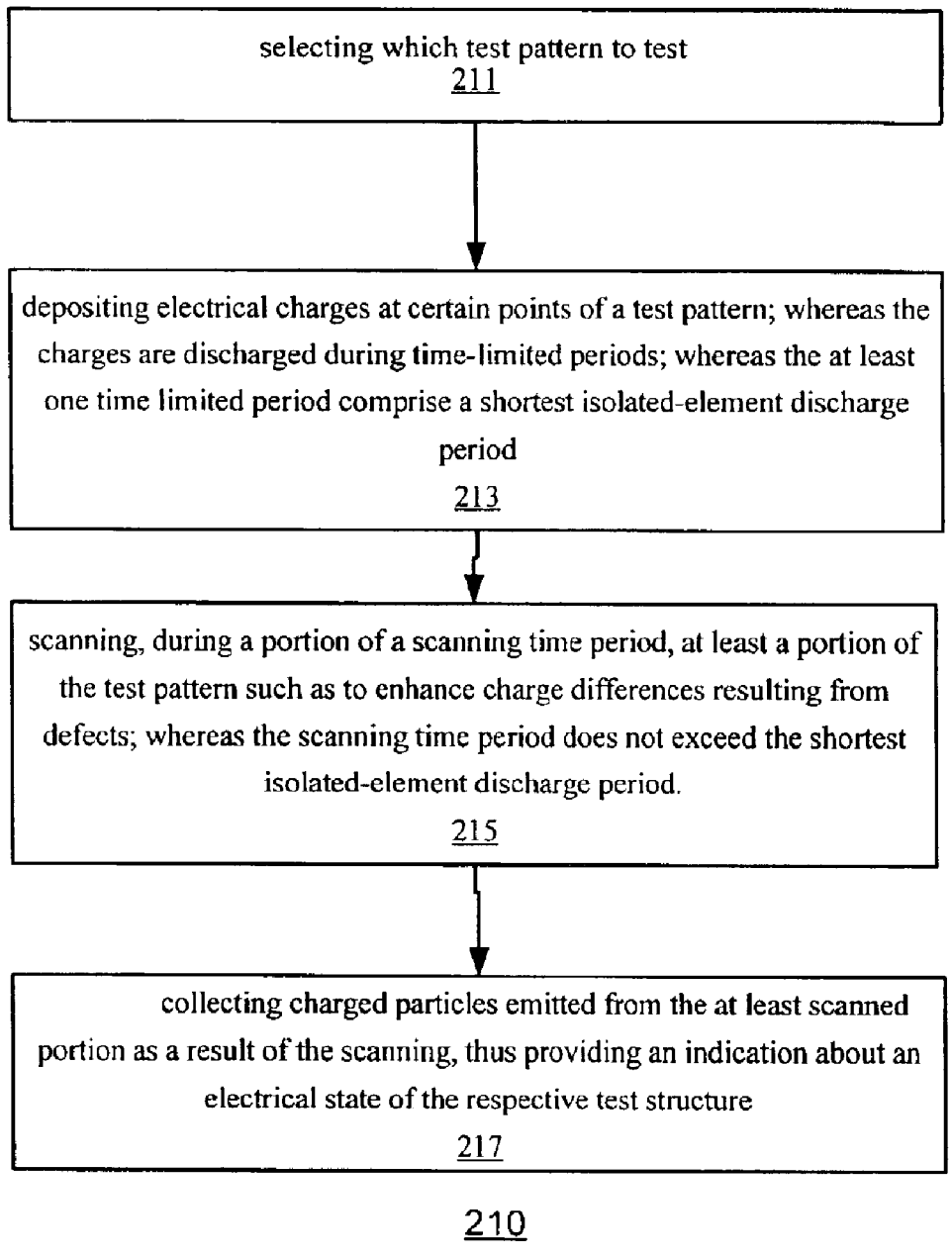

FIG. 7 is a flow chart illustrating a method 210 for electrically testing a semiconductor wafer. Method 210 starts by step 212 of depositing electrical charges at certain points of a test pattern; whereas the charges are discharged during time-limited periods; whereas the at least one time limited period comprise a shortest isolated-element discharge period. As the charge may propagate through many connected conductors, as a multiple discharge paths may be formed between these conductors and a ground, the critical discharge path is defined by a shortest isolated-element discharge period.

Step 212 is followed by step 214 of scanning, during a portion of a scanning time period, at least a portion of the test pattern such as to enhance charge differences resulting from defects; whereas the scanning time period does not exceed the shortest isolated-element discharge period.

Step 214 is followed by step 216 of collecting charged particles emitted from the at least scanned portion as a result of the scanning, thus providing an indication about an electrical state of the respective test structure.

According to another aspect of the invention, step 212 is preceded by a preliminary step 211 of selecting which test pattern out of multiple test structures to test.

FIG. 8 is a flow chart illustrating a method 220 for electrically testing a semiconductor wafer. Method 220 starts at step 222 of depositing electrical charges at certain points of a test pattern.

Step 222 is followed by step 224 of scanning at least a portion of the test pattern such as to compensate for discharge of said electrical charges. It is noted that the discharge occurs as a result of the resistance and capacitance of the layers of the multi-layered wafer. Each discharge path may be characterized by its own resistance and conductivity that define the discharge period.

Step 224 is followed by step 226 of collecting charged particles emitted from the at least scanned portion as a result of the scanning, thus providing an indication about an electrical state of the respective test structure.

It will also be appreciated that many more different structures and patterns are possible, all coming within the scope of the invention, as defined in the claims to follow.

What is claimed is:

1. A method for electrically testing a semiconductor wafer, the method comprising:
    depositing electrical charges at certain points of a test pattern;
    scanning at least a portion of the test pattern such as to enhance charge differences resulting from defects; and
    collecting charged particles emitted from the at least scanned portion as a result of the scanning, thus providing an indication about an electrical state of a test structure,
    whereas the charges are discharged during time-limited periods; whereas the at least one time limited period comprise a shortest isolated-element discharge period; and whereas the scanning time period does not exceed the shortest isolated-element discharge period.

2. The method of claim 1 further comprising a step of scanning at least a region of the test structure in response to the electrical state of the test structure.

3. The method of claim 2 wherein the electrical state indicates a presence of a defect.

4. The method of claim 1 wherein the test pattern is isolated from a point of fixed voltage potential.

5. The method of claim 1 wherein the test structure comprises a first and second ends being electrically coupled to each other by conductive material, whereas the first end is maintained at a substantially fixed voltage potential; and wherein at least one scanning path being followed during the step of scanning ends at the first end.

6. The method of claim 1 wherein the test structure comprises a first and second end being electrically coupled to each other by conductive material, whereas the first end is maintained at a substantially fixed voltage potential; and wherein at least one scanning path being followed during the step of scanning starts at the second end.

7. The method of claim 1 wherein the step of scanning comprising sampling a charge pattern formed by the step of depositing electrical charges.

8. The method of claim 1 wherein the step of scanning comprises scanning a first scan path; and if a suspected fault is detected further scanning a portion of the test pattern along a second scan path.

9. The method of claim 1 wherein the step of scanning comprises a longitudinal scan of the test structure, whereas if a certain region of the test structure is suspected to be defected, further performing a latitudinal scan of the test structure.

10. The method of claim 1 wherein the test structure belongs to a group of test structures that are electrically coupled to each other.

11. The method of claim 10 wherein the steps of depositing electrical charges and scanning at least a portion of the test pattern are preceded by a step of selecting which test structure out of the group of test structures to charge and scan.

12. The method of claim 11 wherein the step of selecting comprises charging and imaging the test structures of the group of test structures.

13. The method of claim 12 wherein the step of selecting comprises receiving a selection indication.

14. The method of claim 12 wherein the selection is responsive to a design of a portion of the semiconductor wafer.

15. A method for electrically testing a semiconductor wafer, the method comprising:
    depositing electrical charges at certain points of a test pattern; whereas the charges are discharged during time-limited periods; whereas the at least one time limited period comprise a shortest isolated-element discharge period;
    scanning, during a portion of a scanning time period, at least a portion of the test pattern such as to enhance charge differences resulting from defects; whereas the scanning time period does not exceed the shortest isolated-element discharge period; and
    collecting charged particles emitted from the at least scanned portion as a result of; the scanning, thus providing an indication about an electrical state of a test structure.

16. The method of claim 15 whereas the charges are discharged during time-limited periods; whereas the at least one time limited period comprise a shortest isolated-element discharge period; and whereas the scanning time period does not exceed the shortest isolated-element discharge period.

17. The method of claim 16 further comprising a step of scanning at least a region of the test structure in response to the electrical state of the test structure.

18. An apparatus for electrically testing a semiconductor wafer, the apparatus comprising:
means for depositing electrical charges at certain points of a test pattern;
means for scanning at least a portion of the test pattern such as to enhance charge differences resulting from defects; and
means for collecting and analyzing charged particles emitted from the at least scanned portion as a result of the scanning, operable to provide an indication about an electrical state of a test structure,
wherein the test structure comprises a first and second end being electrically coupled to each other by conductive material, whereas the first end is maintained at a substantially fixed voltage potential; and wherein at least one scanning path being followed during the step of scanning starts at the second end.

19. The apparatus of claim 18 further configured to scan at least a region of the test structure in response to the electrical state of the test structure.

20. The apparatus of claim 18 wherein the electrical state indicates a presence of a defect.

21. The apparatus of claim 18 wherein the test pattern is isolated from a point of fixed voltage potential.

22. An apparatus for electrically testing a semiconductor wafer, the method comprising:
depositing means for depositing electrical charges at certain points of a test pattern; whereas the charges are discharged during time-limited periods; whereas the at least one time limited period comprise a shortest isolated-element discharge period;
scanning means for scanning, during a portion of a scanning time period, at least a portion of the test pattern such as to enhance charge differences resulting from defects; whereas the scanning time period does not exceed the shortest isolated-element discharge period; and
collecting and analyzing means for collecting charged particles emitted from the at least scanned portion as a result of the scanning, thus providing an indication about an electrical state of a test structure.

23. The apparatus of claim 22 whereas the charges are discharged during time-limited periods; whereas the at least one time limited period comprise a shortest isolated-element discharge period; and whereas the scanning time period does not exceed the shortest isolated-element discharge period.

24. The apparatus of claim 23 further operable to sample a charge pattern formed by the step of depositing electrical charges.

25. The apparatus of claim 22 further operable to scan a first scan path; and if a suspected fault is detected further scan a portion of the test pattern along a second scan path.

26. An apparatus for electrically testing a semiconductor wafer, the method comprising:
depositing means for depositing electrical charges at certain points of a test pattern;
scanning means for scanning at least a portion of the test pattern such as to compensate for discharge of said electrical charges; and
collecting and analyzing means for collecting charged particles emitted from the at least scanned portion as a result of the scanning, thus providing an indication about an electrical state of a test structure,
whereas the charges are discharged during time-limited periods; whereas the at least one time limited period comprise a shortest isolated-element discharge period; and whereas the scanning time period does not exceed the shortest isolated-element discharge period.

27. The apparatus of claim 26 further operable to perform a longitudinal scan of the test structure, whereas if a certain region of the test structure is suspected to be defected, further perform a latitudinal scan of the test structure.

28. The apparatus of claim 26 wherein the test structure belongs to a group of test structures that are electrically coupled to each other.

29. The apparatus of claim 28 operable to select which test structure out of the group of test structures to charge and scan, prior to the deposition of electrical charges and the scan of at least a portion of the test pattern.

30. The apparatus of claim 29 wherein the step of selecting comprises charging and imaging the test structures of the group of test structures.

31. The apparatus of claim 29 wherein the step of selecting comprises receiving a selection indication.

32. The apparatus of claim 29 wherein the selection is responsive to a design of a portion of the semiconductor wafer.

33. A method for electrically testing a semiconductor wafer, the method comprising:
depositing electrical charges at certain points of a test pattern;
scanning at least a portion of the test pattern such as to compensate for discharge of said electrical charges; and
collecting charged particles emitted from the at least scanned portion as a result of the scanning, thus providing an indication about an electrical state of a test structure,
whereas the charges are discharged during time-limited periods; whereas the at least one time limited period comprise a shortest isolated-element discharge period; and whereas the scanning time period does not exceed the shortest isolated-element discharge period.

34. The method of claim 33 further comprising a step of scanning at least a region of the test structure in response to the electrical state of the test structure.

35. The method of claim 34 wherein the electrical state indicates a presence of a defect.

36. The method of claim 33 wherein the test pattern is isolated from a point of fixed voltage potential.

37. The method of claim 33 wherein the test structure comprises a first and second ends being electrically coupled to each other by conductive material, whereas the first end is maintained at a substantially fixed voltage potential; and wherein at least one scanning path being followed during the step of scanning ends at the first end.

38. The method of claim 33 wherein the test structure comprises a first and second end being electrically coupled to each other by conductive material, whereas the first end is maintained at a substantially fixed voltage potential; and wherein at least one scanning path being followed during the step of scanning starts at the second end.

39. The method of claim 33 wherein the test structure belongs to a group of test structures that are electrically coupled to each other.

40. The method of claim 39 wherein the steps of depositing electrical charges and scanning at least a portion of the test pattern are preceded by a step of selecting which test structure out of the group of test structures to charge and scan.

41. A method for electrically testing a semiconductor wafer during integrated-circuit fabrication process, the method comprising the steps of:
   depositing electrical charges at certain points of a test pattern such as to induce a charge pattern; and
   sampling the charge pattern such as to enhance charge differences resulting from defects, thus providing an indication about an electrical state of a test structure;
   whereas the charges are discharged during time-limited periods; whereas the at least one time limited period comprise a shortest isolated-element discharge period; and whereas the sampling time period does not exceed the shortest isolated-element discharge.

42. The method of claim 41 further comprising a step of scanning at least a region of the test structure in response to the electrical state of the test structure.

43. The method of claim 42 wherein the electrical state indicates a presence of a defect.

44. The method of claim 41 wherein the test structure belongs to a group of test structures that are electrically coupled to each other.

45. The method of claim 44 wherein the steps of depositing electrical charges and scanning at least a portion of the test pattern are preceded by a step of selecting which test structure out of the group of test structures to charge and scan.

* * * * *